US008551863B2

(12) United States Patent
Matsushima et al.

(10) Patent No.: US 8,551,863 B2
(45) Date of Patent: Oct. 8, 2013

(54) METHOD FOR MANUFACTURING FERROELECTRIC DEVICE

(75) Inventors: Tomoaki Matsushima, Kyoto (JP); Norihiro Yamauchi, Osaka (JP); Junya Ogawa, Osaka (JP); Koichi Aizawa, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/638,129

(22) PCT Filed: Mar. 30, 2011

(86) PCT No.: PCT/JP2011/058048
§ 371 (c)(1),
(2), (4) Date: Sep. 28, 2012

(87) PCT Pub. No.: WO2011/125754
PCT Pub. Date: Oct. 13, 2011

(65) Prior Publication Data
US 2013/0023063 A1    Jan. 24, 2013

(30) Foreign Application Priority Data
Mar. 31, 2010  (JP) ................................. 2010-083864

(51) Int. Cl.
*H01L 41/27*    (2013.01)
*H01L 41/00*    (2013.01)
(52) U.S. Cl.
USPC ........... 438/458; 438/54; 438/3; 257/E21.211
(58) Field of Classification Search
CPC .................................................. H01L 41/273
USPC .......... 438/3; 257/E21.211; 310/311, 323.06, 310/327, 342, 216.065, 216.137, 330, 314; 361/748; 174/260
See application file for complete search history.

(56) References Cited

U.S. PATENT DOCUMENTS 6,347,862 B1 * 2/2002 Kanno et al. .................... 347/68
6,666,943 B2 * 12/2003 Wada et al. ..................... 156/230
(Continued)

FOREIGN PATENT DOCUMENTS

JP  2002-134806    5/2002
JP  2003-309303    10/2003
(Continued)

OTHER PUBLICATIONS

U.S. Appl. No. 13/642,208 to Junya Ogawa et al., which was filed Oct. 19, 2012.

(Continued)

*Primary Examiner* — Jarrett Stark
*Assistant Examiner* — Bitew Dinke
(74) *Attorney, Agent, or Firm* — Greenblum & Bernstein, P.L.C.

(57) ABSTRACT

A seed layer having a predetermined pattern is formed on a side of one surface of a second substrate, and a ferroelectric layer is formed on the side of the one surface of the second substrate. A lower electrode is formed on the ferroelectric layer, and the lower electrode and a first substrate are bonded via a bonding layer. A laser beam with a predetermined wavelength is irradiated from a side of other surface of the second substrate to transfer a ferroelectric film, which overlaps with the seed layer, of the ferroelectric layer and the seed layer onto the side of said one surface of the first substrate. The laser beam passes through the second substrate, is reflected by the seed layer, and is absorbed by a second portion of the ferroelectric layer. The second portion does not overlap with the seed layer.

16 Claims, 8 Drawing Sheets

(56) References Cited

U.S. PATENT DOCUMENTS

| | | | |
|---|---|---|---|
| 6,911,107 B2 | 6/2005 | Kagawa et al. | |
| 7,070,669 B1* | 7/2006 | White et al. | 156/89.11 |
| 7,323,806 B2* | 1/2008 | Shibata et al. | 310/358 |
| 2002/0066524 A1* | 6/2002 | Kagawa et al. | 156/235 |
| 2002/0146893 A1* | 10/2002 | Shimoda et al. | 438/458 |
| 2004/0164650 A1* | 8/2004 | Xu et al. | 310/328 |
| 2005/0134144 A1* | 6/2005 | Buhler et al. | 310/317 |
| 2006/0211217 A1* | 9/2006 | Xu et al. | 438/455 |
| 2008/0225089 A1* | 9/2008 | Tsukamoto | 347/72 |
| 2009/0113685 A1* | 5/2009 | Xu et al. | 29/25.35 |
| 2010/0167215 A1* | 7/2010 | Suzuki et al. | 430/325 |
| 2010/0213795 A1* | 8/2010 | Li et al. | 310/358 |

FOREIGN PATENT DOCUMENTS

| | | |
|---|---|---|
| JP | 2006-245094 | 9/2006 |
| JP | 2009-232283 | 10/2009 |
| JP | 2011-071467 | 4/2011 |

OTHER PUBLICATIONS

International Search Report in International Application No. PCT/JP2011/058048, dated Jun. 28, 2011.

* cited by examiner

FIG. 4
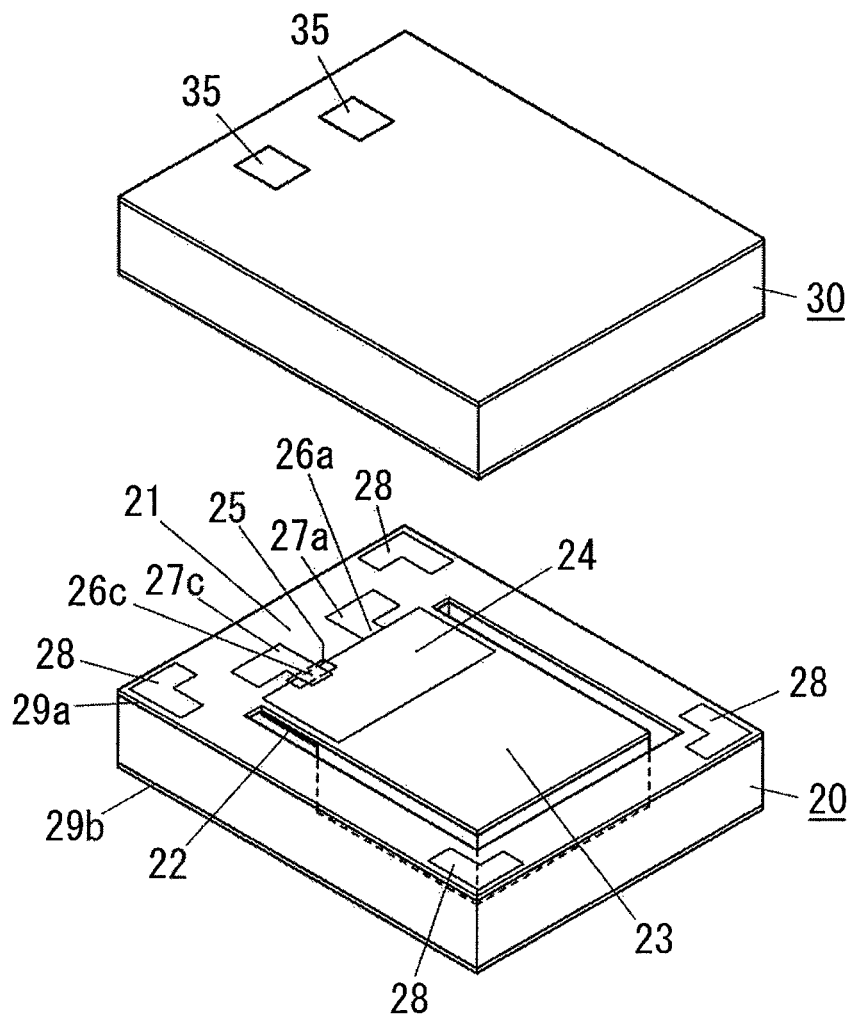
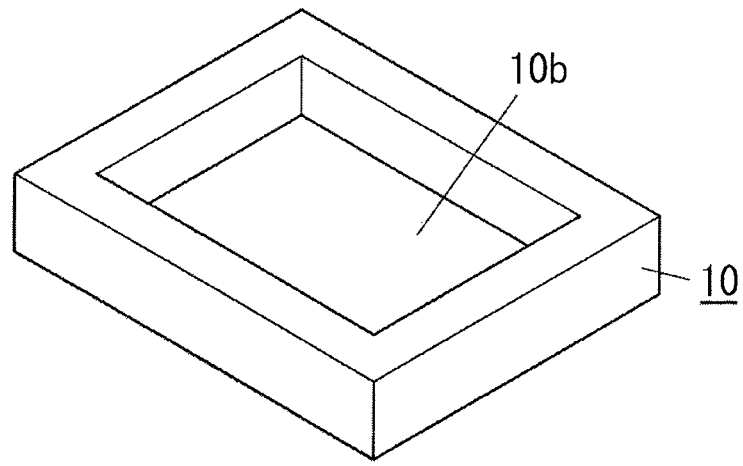

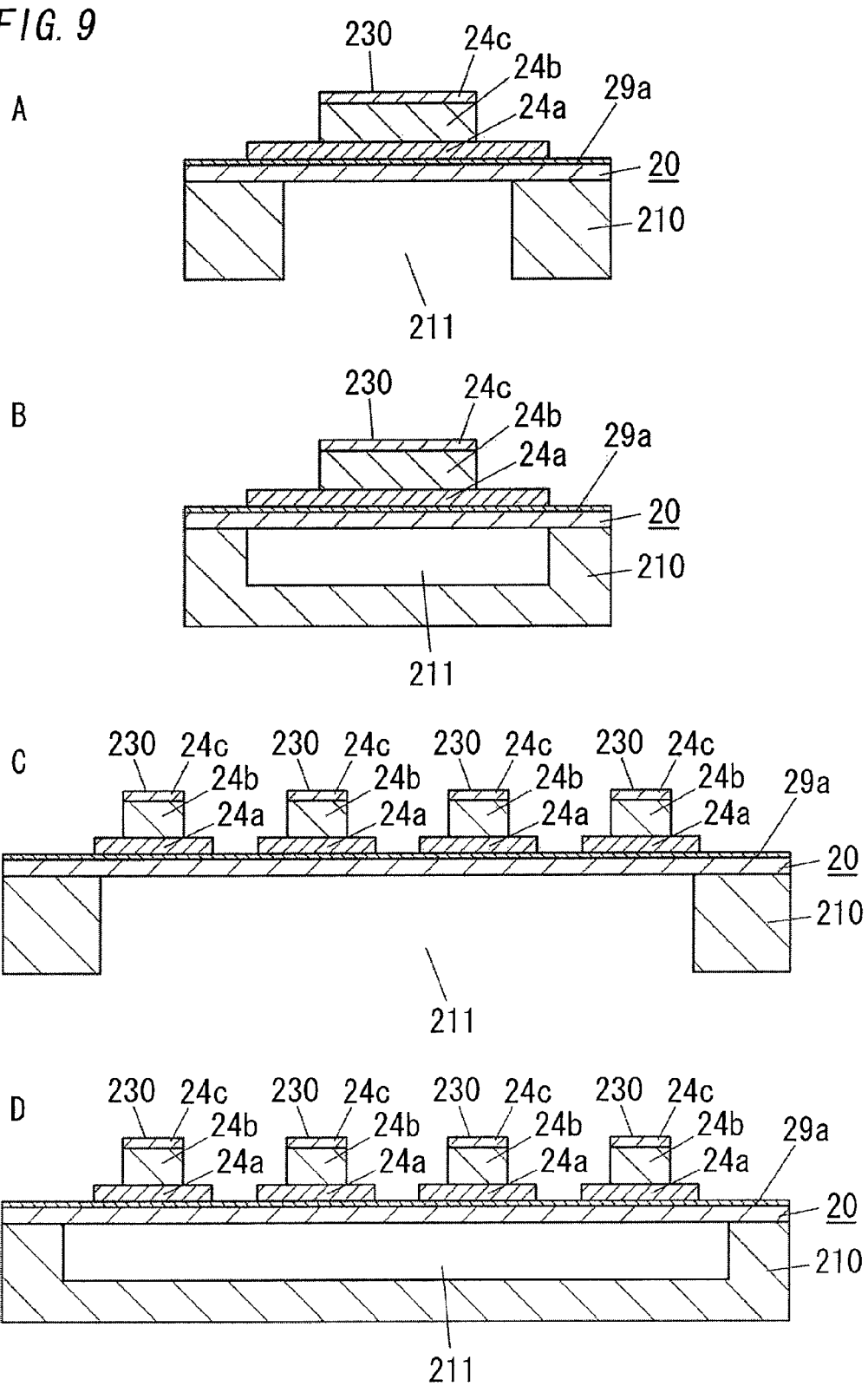

METHOD FOR MANUFACTURING FERROELECTRIC DEVICE

TECHNICAL FIELD

The present invention relates to a method for manufacturing a ferroelectric device that uses a piezoelectric effect or a pyroelectric effect of a ferroelectric film.

BACKGROUND ART

Conventionally, ferroelectric devices that use a piezoelectric effect or a pyroelectric effect of a ferroelectric film have been attracting attention.

As an example of a ferroelectric device of this type, conventionally, a MEMS (micro electro mechanical systems) device comprising a ferroelectric film as a function membrane has been proposed. As MEMS devices of this type, for example, a power-generating device and an actuator which use a piezoelectric effect of a ferroelectric film, and pyroelectric devices such as a pyroelectric infrared sensor which use a pyroelectric effect of a ferroelectric film are being developed at various facilities. Moreover, as a ferroelectric material that exhibits both a piezoelectric effect and a pyroelectric effect, for example, PZT (:Pb(Zr,Ti)O$_3$) that is a type of a lead-based oxide ferroelectric is widely known.

In addition, conventionally, as a method for manufacturing a MEMS device having a ferroelectric film between a pair of electrodes, a method for manufacturing an actuator has been proposed which comprises: a step of forming a piezoelectric film that is a ferroelectric film on an electrode formed on an intermediate transfer body; a step of bonding together the piezoelectric film on the intermediate transfer body and a vibrating structure via a bonding layer; and a step of peeling the intermediate transfer body from the electrode (refer to Patent Document 1).

Patent Document 1 describes that MgO or the like may be adopted as a material of the intermediate transfer body, PZT or the like may be adopted as a material of the piezoelectric film, and Si or the like may be adopted as a material of the vibrating structure.

Patent Document 1 also describes adopting a metal such as Pd, In, Sn, Ni, Ga, Cu, Ag, Mo, Ti, or Zr as a material of the bonding layer, forming the bonding layer on both the piezoelectric film and the vibrating structure, and bonding together the bonding layers by electrical heating, electrical pressure welding, or the like. Moreover, the bonding layer formed on the vibrating structure (a first bonding layer) is formed so as to span across a plurality of bonding layers (second bonding layers) respectively formed on surfaces of the plurality of patterned piezoelectric films.

Patent Document 1 also describes peeling the intermediate transfer body from the electrode by irradiating a laser beam that passes through the intermediate transfer body from the side of the intermediate transfer body.

Furthermore, Patent Document 1 describes constituting one electrode by the electrode described above and constituting another electrode by the bonding layers described above.

According to the method for manufacturing a MEMS device described above, a greater number of options for the material of the vibrating structure are provided, crystallinity and performance of the piezoelectric film can be arbitrarily adjusted, and the intermediate transfer body can be reused.

Patent Document 1: Japanese Patent Published Application No. 2003-309303

However, in the case of the method for manufacturing a MEMS device described in Patent Document 1, since the piezoelectric film on the intermediate transfer body and the vibrating structure are then bonded via the bonding layer after patterning the piezoelectric film that is a ferroelectric film, a step of patterning the piezoelectric film using a photolithographic technique and an etching technique is required. As a result, manufacturing cost increases. Alternatively, in a case where the piezoelectric film and the vibrating structure are bonded without patterning the piezoelectric film, the piezoelectric film must be patterned after bonding.

DISCLOSURE OF THE INVENTION

The present invention has been made in consideration of the reasons described above, and an object of the present invention is to provide a method for manufacturing a ferroelectric device capable of improving crystallinity and performance of a ferroelectric film, reducing cost, and simplifying a manufacturing process.

A method for manufacturing a ferroelectric device for achieving the object described above is a method for manufacturing a ferroelectric device comprising a first substrate, a lower electrode, a ferroelectric film, and an upper electrode. The lower electrode is formed on one surface of the first substrate. The ferroelectric film is formed on the lower electrode of an opposite side to the first substrate. The upper electrode is formed on the ferroelectric film of an opposite side to the lower electrode. The method for manufacturing a ferroelectric device comprises a seed layer forming step, a ferroelectric layer forming step, a lower electrode forming step, a bonding step, and a transferring step. In the seed layer forming step, a seed layer with a predetermined pattern and made from a metallic material is formed on a side of one surface of a second substrate. The ferroelectric layer forming step is performed after the seed layer forming step. In the ferroelectric layer forming step, a ferroelectric layer made of a ferroelectric material is formed on said one surface of the second substrate. The lower electrode forming step is performed after the ferroelectric layer forming step. In the lower electrode forming step, the lower electrode is formed on the ferroelectric layer. The bonding step is performed after the lower electrode forming step. In the bonding step, the lower electrode and the first substrate are bonded via a bonding layer. The transferring step is performed after the bonding step. The transferring step includes irradiating a laser beam with a predetermined wavelength from the side of said other surface of the second substrate to transfer a first portion of the ferroelectric film and the seed layer onto the side of said one surface of the first substrate. The first portion of the ferroelectric film is defined by a portion that overlaps the seed layer among the ferroelectric layer. The laser beam has a wavelength so as to pass through the second substrate. In addition, the predetermined wavelength of the laser beam is a wavelength so as to be reflected by the seed layer. Furthermore, the predetermined wavelength of the laser beam is a wavelength so as to be absorbed by a second portion of the ferroelectric layer.

Preferably, the second substrate exhibits more consistency with the ferroelectric film than the first substrate.

Preferably, the seed layer exhibits satisfactory lattice consistency with the ferroelectric film.

Preferably, the ferroelectric film is formed of a ferroelectric material that differs in lattice constants from the first substrate.

In other words, the method for manufacturing a ferroelectric device is a method for manufacturing a ferroelectric device. The ferroelectric device comprises a lower electrode, a ferroelectric film, and an upper electrode. Herein, the lower electrode is formed on a side of one surface of a first substrate, the ferroelectric film is formed on an opposite side of the lower electrode to the first substrate, and the upper electrode is formed on an opposite side of the ferroelectric film to the lower electrode wherein, the ferroelectric film comprises a ferroelectric material that has difference in lattice constants from the first substrate, wherein the method preferably comprises: a seed layer forming step of forming a seed layer having a predetermined pattern on a side of one surface of a second substrate having better lattice consistency with the ferroelectric film than the first substrate and made from a metallic material having better lattice consistency with the ferroelectric film than the first substrate; a ferroelectric layer forming step of forming a ferroelectric layer made of the ferroelectric material on the side of said one surface of the second substrate after the seed layer forming step; a lower electrode forming step of forming the lower electrode on the ferroelectric layer after the ferroelectric layer forming step; a bonding step of bonding the lower electrode and the first substrate via a bonding layer after the lower electrode forming step; and a transferring step of transferring the ferroelectric film and the seed layer onto the side of said one surface of the first substrate by irradiating a laser beam with a predetermined wavelength from a side of other surface of the second substrate after the bonding step, wherein said ferroelectric film is formed form a first portion of the ferroelectric layer, said first potion overlapping on the seed layer, wherein the laser beam with the predetermined wavelength is a beam with a wavelength, wherein the laser beam passes through the second substrate, and is reflected by the seed layer, and moreover is absorbed by a second portion, the second portion not overlapping on the seed layer.

In this method for manufacturing a ferroelectric device, preferably, the material of the bonding layer is a metal configured to be directly bonded with the lower electrode, and a pattern of the bonding layer is formed on the side of said one surface of the first substrate before the bonding step.

In this method for manufacturing a ferroelectric device, preferably, a room temperature-setting resin adhesive is adopted as the material of the bonding layer.

In this method for manufacturing a ferroelectric device, preferably, PZT is adopted as the ferroelectric material.

Preferably, an MgO substrate is used as the second substrate.

Preferably, the predetermined wavelength is set to at least 400 nm.

Preferably, the predetermined wavelength is set in the range of 400 nm to 1100 nm.

Preferably, the predetermined wavelength is set in the range of 400 nm to 750 nm.

Preferably, the laser beam is any of a femtosecond laser, a third harmonic of a KrF excimer laser, a third harmonic of an ArF excimer laser, and a third harmonic of a femtosecond laser.

In this method for manufacturing a ferroelectric device, preferably, the ferroelectric film is a piezoelectric film and the seed layer is constituted as the upper electrode.

In this method for manufacturing a ferroelectric device, preferably, the ferroelectric film is a pyroelectric film, a seed layer removing step of removing the seed layer is performed after the transferring step and, subsequently, an upper electrode forming step is performed in which the upper electrode made of an infrared-absorbing material is formed on the ferroelectric film.

A lattice constant of the ferroelectric film has a first difference from a lattice constant of the first substrate. The lattice constant of the ferroelectric film has a second difference from a lattice constant of the second substrate. In addition, preferably, the second difference is smaller than the first difference.

Preferably, the seed layer is made of Pt or Al.

The second substrate has a first region and a second region on said one surface of the second substrate. Preferably, the first region is covered by a seed layer having a predetermined pattern. In addition, preferably, the second region is exposed by the seed layer having a predetermined pattern.

Preferably, the first portion of the ferroelectric layer overlaps with the first region. Preferably, the second portion of the ferroelectric layer overlaps with the second region.

With the method for manufacturing a ferroelectric device according to the present invention, crystallinity and performance of a ferroelectric film can be improved, and cost reduction can be achieved, too. In addition, a manufacturing process can be simplified.

BRIEF DESCRIPTION OF THE DRAWINGS

FIG. 4 is a schematic exploded perspective view of the ferroelectric device according to the first embodiment;

FIG. 9 is a schematic sectional view showing an application example of a ferroelectric device according to the second embodiment.

BEST MODE FOR CARRYING OUT THE INVENTION

First Embodiment

Figure 1:
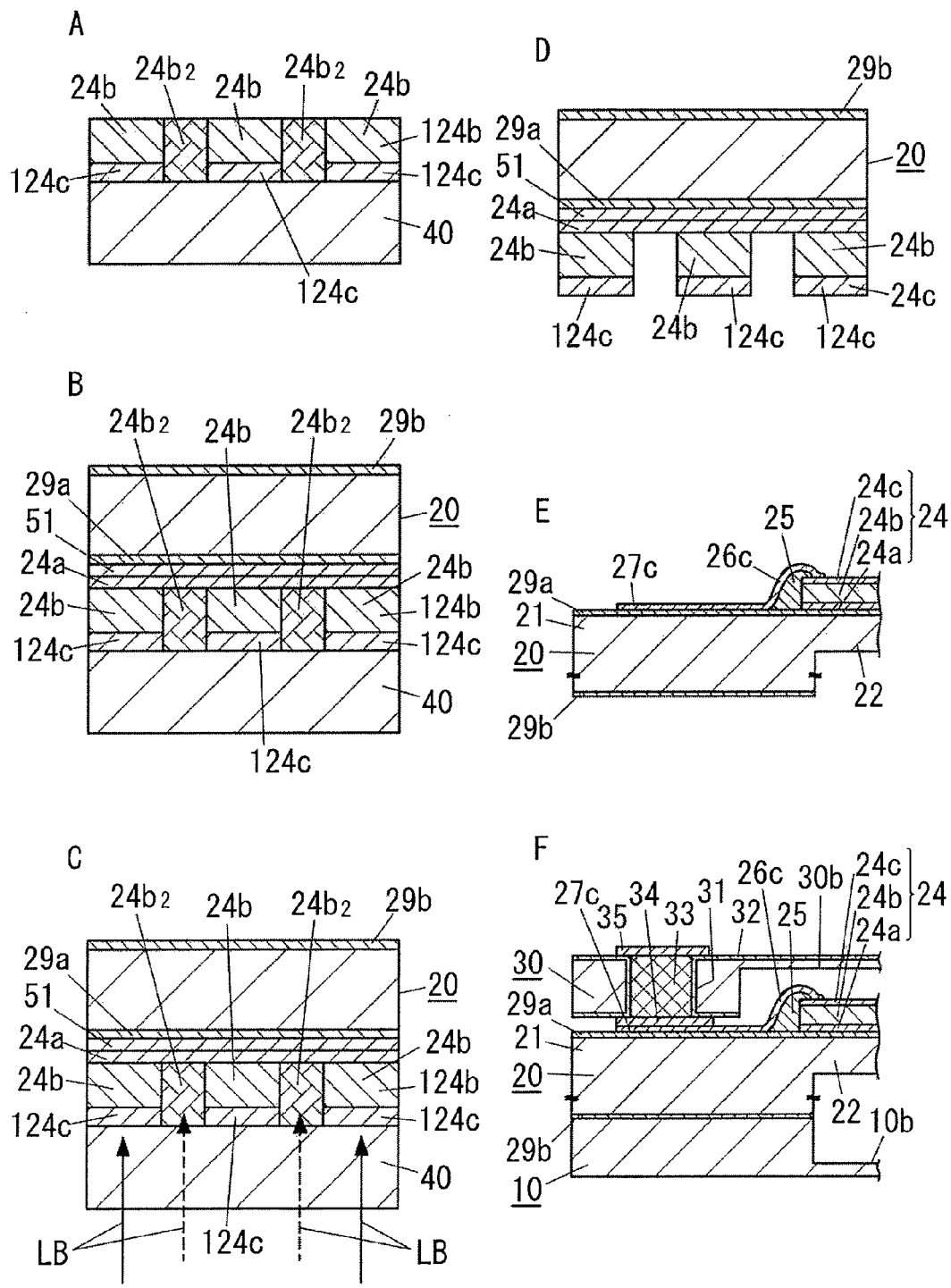
FIG. 1 is a sectional primary process chart for explaining a method for manufacturing a ferroelectric device according to a first embodiment.
Figure 5:
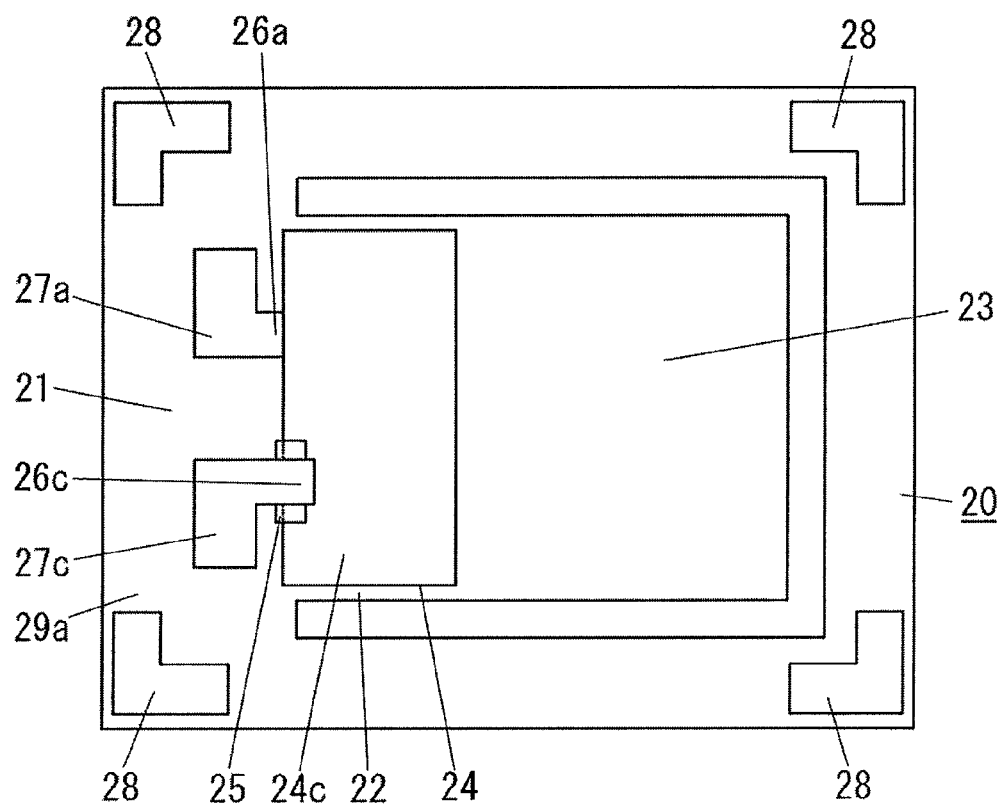
FIG. 5 is a schematic plan view of a substantial part of the ferroelectric device according to the first embodiment.
Figure 6:
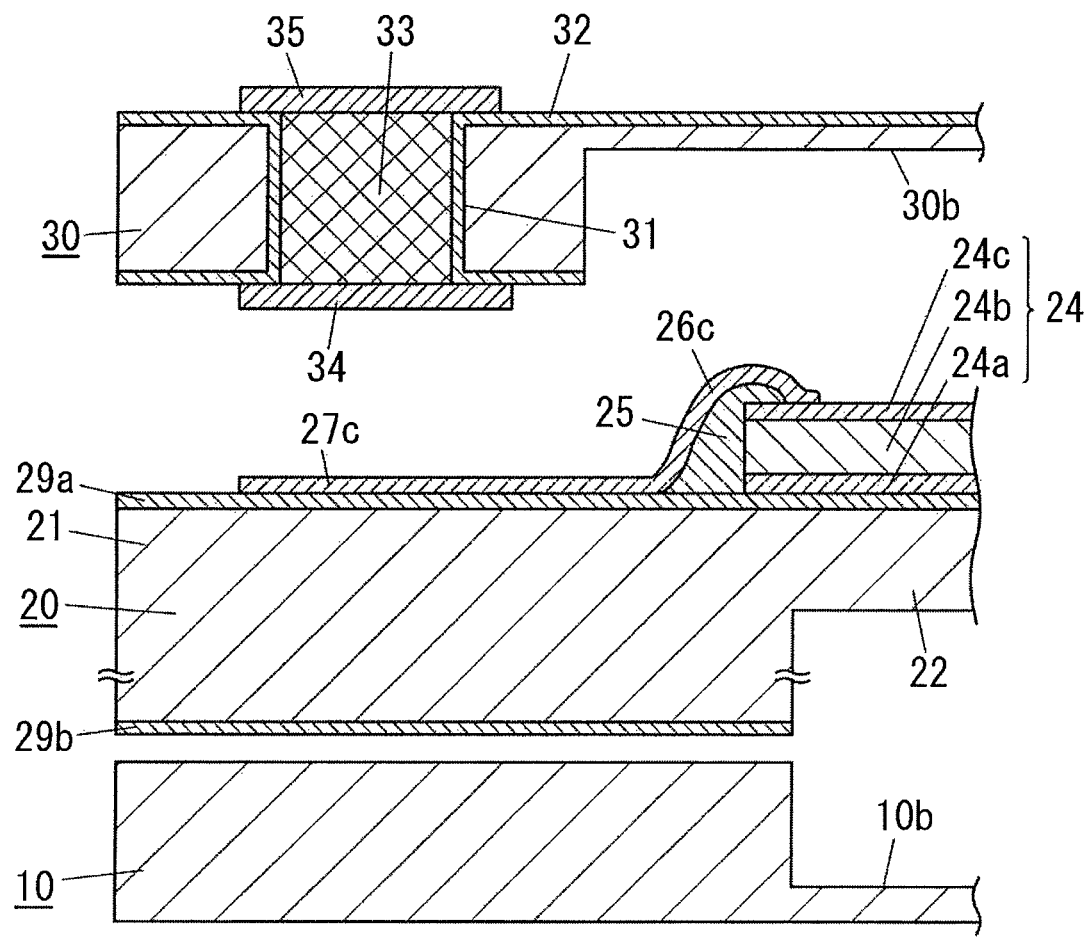
FIG. 6 is a schematic exploded sectional view of a substantial part of the ferroelectric device according to the first embodiment.

First, a ferroelectric device according to the present embodiment will be described with reference to FIGS. 4 to 6 and, subsequently, a manufacturing method will be described with reference to FIGS. 1 to 3.

A ferroelectric device comprises a lower electrode 24a formed on one surface of a first substrate 20, a ferroelectric film 24b formed on an opposite side of the lower electrode 24a to the first substrate 20, and an upper electrode 24c formed on an opposite side of the ferroelectric film 24b to the lower electrode 24a. In this case, the ferroelectric film 24b is formed of a ferroelectric material having difference in lattice constants from the first substrate 20.

Moreover, one surface of the first substrate in a thickness direction of the first substrate is defined as a first surface of the first substrate, and the side of other surface of the first substrate in the thickness direction of the first substrate is defined as a second surface of the first substrate.

The ferroelectric device according to the present embodiment is a power-generating device which converts vibrational energy to electric energy. Herein, the vibrational energy is attributable to arbitrary vibration such as a vibration of a vehicle or a vibration caused by a movement of a person. In this case, the ferroelectric film 24b described above constitutes a piezoelectric film.

The first substrate 20 is formed by using a silicon substrate (a first silicon substrate) and comprises a frame section 21 and a cantilever section 22 which is arranged on an inner side of the frame section 21 and which is supported by the frame section 21 so as to become shakably.

In the power-generating device, a power-generating section 24 is formed on the cantilever section 22 of the first substrate 20. Herein, the power-generating section 24 consists of a piezoelectric transducing section (a piezoelectric transducing element) and comprises the lower electrode 24a, the ferroelectric film 24b, and the upper electrode 24c described above. In other words, the power-generating section 24 generates an alternating-current voltage in response to a vibration of the cantilever section 22. A weight section 23 for increasing displacement of the cantilever section 22 is integrally provided at a tip section of the cantilever section 22 of the first substrate 20.

In addition, the power-generating device comprises a first cover substrate 30 fastened onto the frame section 21 of said one surface side (an upper surface side in FIG. 6; a first surface side) of the first substrate 20. Furthermore, the power-generating device comprises a second cover substrate 10 fastened onto the frame section 21 of the side of other surface (a lower surface side in FIG. 6; a second surface side) of the first substrate 20.

On said one surface side (the first surface side) of the first substrate described above, Pads 27a and 27b are electrically connected to the lower electrode 24a and the upper electrode 24c via metal wirings 26a and 26c, respectively. Herein, each of pads 27a and 27b is formed at suitable position on the frame section 21. In the power-generating section 24, planar sizes of the lower electrode 24a, the ferroelectric film 24b, and the upper electrode 24c are set the same.

In addition, an insulating layer 25 for preventing short circuit between the metal wiring 26c electrically connected to the upper electrode 24c and the lower electrode 24a is formed on said one surface side (the first surface side) of the first substrate 20 so as to cover a part of an end section of the power-generating section 24 on the side of the frame section 21. Moreover, while the insulating layer 25 is constituted by a silicon oxide film, the insulating layer 25 is not limited to the silicon oxide film and may instead be constituted by a silicon nitride film. Furthermore, insulating films 29a and 29b constituted by silicon oxide films are respectively formed on said one surface (the first surface) and the side of said other surface (the second surface side) of the first substrate 20, and the first substrate 20 and the power-generating section 24 are electrically insulated from each other by the insulating film 29a.

In addition, the first cover substrate 30 is formed by using a silicon substrate (a second silicon substrate). Furthermore, a depression 30b for forming a displacement space of a movable section comprising the cantilever section 22 and the weight section 23 between the first cover substrate 30 and the first substrate 20 is formed on one surface of the first cover substrate 30 on the side of the first substrate 20.

In addition, output electrodes 35 for supplying the alternating-current voltage generated by the power-generating section 24 to the outside are formed on the side of other surface (the second surface side) of the first cover substrate 30. In the first cover substrate 30, the output electrodes 35 and communication electrodes 34 formed on the side of said one surface (the first surface) of the first cover substrate 30 are electrically connected to each other via through hole wirings 33 provided so as to penetrate the first cover substrate 30 in a thickness direction of the first cover substrate 30. In this case, in the first cover substrate 30, the communication electrodes 34 are respectively bonded and electrically connected to the pads 27a and 27c of the first substrate 20. Moreover, in the present embodiment, although the output electrodes 35 and the communication electrodes 34 are constituted by laminated films of a Ti film and an Au film, these materials are not particularly restrictive. In addition, while Cu is adopted as a material of the through hole wirings 33, the through hole wirings 33 are not limited to Cu and, for example, Ni, Al, and the like may be adopted instead.

On the first cover substrate 30, an insulating film 32 made of a silicon oxide film for preventing short circuit between the two output electrodes 35 is formed so as to span across the side of said one surface (the first surface side) and the side of said other surface (the second surface side) of the first cover substrate 30 and an inner circumferential surface of a through hole 31 inside which the through hole wirings 33 are formed. Moreover, in a case where an insulating substrate such as a glass substrate is used as the first cover substrate 30, the insulating film 32 described above need not be provided.

Furthermore, the second cover substrate 10 is formed by using a silicon substrate (a third silicon substrate). A depression 10b for forming a displacement space of the movable section comprising the cantilever section 22 and the weight section 23 between the second cover substrate 10 and the first substrate 20 is formed on one surface (a first surface) of the second cover substrate 10 on the side of the first substrate 20. Moreover, an insulating substrate such as a glass substrate may also be used as the second cover substrate 10.

In addition, a first bonding metallic layer 28 for bonding the first substrate 20 to the first cover substrate 30 is formed on the side of said one surface (the first surface side) of the first substrate 20, and a second bonding metallic layer (not shown) that bonds with the first bonding metallic layer 28 is formed on the first cover substrate 30. In this case, a same material as the pad 27c is adopted as a material of the first bonding metallic layer 28. The first bonding metallic layer 28 is formed with a same thickness as the pad 27c on the side of said one surface (the first surface side) of the first substrate 20.

While the first substrate 20 and the cover substrates 10 and 30 are bonded together by normal temperature bonding, the bonding is not limited to normal temperature bonding and may alternatively be performed by resin bonding using an epoxy resin or the like, by anodic bonding, and the like. With resin bonding, by using a room temperature-setting resin adhesive (for example, a two-component room temperature-setting epoxy resin-based adhesive or a one-component room temperature-setting epoxy resin-based adhesive), a lower bonding temperature can be realized in comparison to a case where a thermosetting resin adhesive (for example, a thermosetting epoxy resin-based adhesive) is used.

With the power-generating device described above, since the power-generating section 24 comprises a piezoelectric transducing section constituted by the lower electrode 24a, the ferroelectric film 24b that is a piezoelectric film, and the upper electrode 24c, the ferroelectric film 24b of the power-generating section 24 is subjected to stress due to a vibration of the cantilever section 22, a bias in electrical charges occurs at the upper electrode 24c and the lower electrode 24a, and an alternating-current voltage is generated at the power-generating section 24.

Meanwhile, the power-generating device according to the present embodiment adopts PZT that is a type of a lead-based piezoelectric material as the ferroelectric material of the ferroelectric film 24b and uses a silicon substrate (a first silicon substrate) in which a (100) plane constitutes said one surface (the first surface) as the first substrate 20. However, the lead-based piezoelectric material is not limited to PZT and PZT-PMN(:Pb(Mn,Nb)O$_3$) or other impurity-added PZTs may be adopted instead. In any case, the ferroelectric material of the ferroelectric film 24b is a ferroelectric material (a lead-based oxide ferroelectric such as PZT, PZT-PMN, or an impurity-added PZT) with a difference in lattice constants from the first substrate 20. In addition, the first silicon substrate that is used as the first substrate 20 is not limited to a single-crystal silicon substrate and may alternatively be a polycrystalline silicon substrate.

Furthermore, in the present embodiment, while Au is adopted as the material of the lower electrode 24a and Pt is adopted as the material of the upper electrode 24c, these materials are not particularly restrictive and, for example, Al may be adopted as the material of the lower electrode 24a and, for example, Mo, Al, or Au may be adopted as the material of the upper electrode 24c.

Moreover, in the power-generating device according to the present embodiment, a thickness of the lower electrode 24a is set to 500 nm, a thickness of the ferroelectric film 24b is set to 600 nm, and a thickness of the upper electrode 24c is set to 100 nm. However, these numerical values are merely examples and are not particularly restrictive. In addition, if $\epsilon$ denotes a relative permittivity of the ferroelectric film 24b and P denotes a power-generating index of the ferroelectric film 24b, a relationship expressed as $PG \propto e_{31}^2/\epsilon$ is true, where the greater the power-generating index P, the greater the power-generating efficiency.

A method for manufacturing the power-generating device that is a ferroelectric device according to the present embodiment will now be described with reference to FIG. 1.

First, the second substrate 40 is prepared. A first surface is provided on one surface of the second substrate in a thickness direction of the second substrate, and a second surface is provided on the side of other surface in the thickness direction of the second substrate.

A seed layer forming step is performed in which a seed layer 124c having a predetermined pattern and made of a metallic material (for example, Pt) with a good lattice consistency with the ferroelectric film 24b is formed on the side of one surface of the second substrate 40 (in other words, the first surface of the second substrate 40) made of a single-crystal MgO substrate having a better lattice consistency with the ferroelectric film 24b than the first substrate 20. Subsequently, by performing a ferroelectric layer forming step in which a ferroelectric layer 124b made of a ferroelectric material (for example, PZT) of the ferroelectric film 24b is formed on the side of said one surface (the first surface side) of the second substrate 40, a structure shown in FIG. 1A is obtained. In this case, while a single-crystal MgO substrate in which a (001) plane constitutes said one surface (the first surface) is used as the second substrate 40, the second substrate 40 is not limited thereto and a single-crystal SrTiO$_3$ substrate in which a (001) plane constitutes said one surface (the first surface) or a sapphire substrate in which a (0001) plane constitutes said one surface (the first surface) may alternatively be adopted. In addition, while a thickness of the second substrate 40 is set to 300 μm, this thickness is not particularly restrictive. Furthermore, in the seed layer forming step, the seed layer 124c may be formed using a film formation technique such as sputtering, CVD, and vapor deposition and a patterning technique that combines a photolithographic technique and an etching technique. Alternatively, the seed layer 124c with a predetermined pattern may be formed using an appropriate shadow mask or the like. In addition, in the ferroelectric layer forming step, the ferroelectric layer 124b is formed by sputtering such as RF magnetron sputtering. Among the ferroelectric layer 124b, first portions respectively overlapping the seed layers 124c in a thickness direction are constituted by crystallized ferroelectric films 24b, and second portions 24b$_2$ not overlapping the seed layers 124c in the thickness direction are amorphous films. Moreover, the film formation method used for the ferroelectric layer 124b is not limited to sputtering and CVD, a sol-gel method, or the like may alternatively be used.

As described above, in the seed layer forming step, the seed layer 124c with a predetermined pattern is provided on one surface of the second substrate 40 (the first surface of the second substrate). Therefore, the second substrate 40 has a first region and a second region. The first region of the second substrate 40 is defined as a region in which the seed layer 124c with a predetermined pattern is provided. The second region of the second substrate is defined as a region in which the seed layer 124c is not provided. In other words, the second region of the second substrate is defined as a region that is exposed by the seed layer 124c.

In addition, in the ferroelectric layer forming step, the ferroelectric layer 124b made of a ferroelectric material is formed on the side of one surface (the first surface side) of the second substrate. The ferroelectric layer 124b comprises the crystallized ferroelectric film 24b and the amorphous film 24b$_2$. The crystallized ferroelectric film 24b overlaps with the seed layer 124c in the thickness direction of the seed layer 124c. The amorphous film 24b$_2$ is arranged offset from the seed layer 124c on the side of one surface (the first surface side) of the second substrate.

Therefore, the first portion of the ferroelectric layer overlaps with the first region of the second substrate in the thickness direction of the second substrate. In addition, the second portion of the ferroelectric layer overlaps with the second region of the second substrate in the thickness direction of the second substrate.

After the ferroelectric layer forming step described above, by first performing a lower electrode forming step in which the lower electrode 24a is formed on the ferroelectric layer 124b and then performing a bonding step in which the lower electrode 24a and the first substrate 20 are bonded together via the bonding layer 51, a structure shown in FIG. 1B is obtained. In this case, in the lower electrode forming step, the lower electrode 24a constituted by an Au layer (a first Au layer) may be formed using sputtering, vapor deposition, and the like. In addition, in the bonding step, after arranging the second substrate 40 and the first substrate 20 so as to oppose each other, the lower electrode 24a on the side of said one surface (the first surface side) of the second substrate 40 and the first substrate 20 are bonded together via the bonding layer 51 formed on the side of said one surface (the first surface side) of the first substrate 20. In this case, the bonding layer 51 is constituted by a Ti layer on the insulating film 29a and an Au layer (a second Au layer) on the Ti layer. The Ti layer is provided in order to improve adhesion between the bonding layer 51 and the insulating film 29a in comparison to a case where the bonding layer 51 is constituted only by the second Au layer. Moreover, in the present embodiment, while the insulating films 29a and 29b are formed by thermal oxidation, a film thickness of the Ti layer is set to 15 to 50 nm, and a film thickness of the second Au layer is set to 500 nm, these numerical values are merely examples and are not particularly restrictive. In addition, a material of an adhesion layer for improving adhesion is not limited to Ti and, for example, Cr, Nb, Zr, TiN, TaN, or the like may be used. Furthermore, the second Au layer is not limited to an Au thin film and, alternatively, an Au particulate layer on which a large number of Au particles are deposited may be used.

In the bonding step described above, after arranging the lower electrode 24a constituted by the first Au layer and the bonding layer 51, on which the second Au layer is formed on a side of an outermost surface of the bonding layer 51, so as to oppose each other, the lower electrode 24a and the bonding layer 51 may be bonded together by normal temperature bonding. In other words, by performing the bonding step, the lower electrode 24a and the first substrate 20 are bonded together via the bonding layer 51. In this case, a combination of materials when performing normal temperature bonding of the lower electrode 24a and the bonding layer 51 is a combination of Au—Au. In the bonding step, after irradiating any of an argon plasma, an argon ion beam, and an argon atomic beam in a vacuum onto respective bonding surfaces (the respective surfaces of the lower electrode 24a and the bonding layer 51) prior to bonding in order to clean and activate the respective bonding surfaces, the bonding surfaces are brought into contact with each other, and an appropriate load is applied under normal temperature to perform direct bonding. Regarding the bonding step, an example of process conditions of normal temperature bonding using a Au—Au combination includes setting a vacuum during irradiation of an argon ion beam to $1 \times 10^{-5}$ Pa or lower, an accelerating voltage to 100 V, an irradiation time to 160 seconds, a load during bonding to 20 kN, and a bonding time to 300 seconds.

A combination of the materials of the lower electrode 24a and the bonding layer 51 is not limited to a Au—Au combination and normal temperature bonding can also be performed using combinations such as Au—AuSn, Al—Al, and Cu—Cu. In addition, the bonding of the lower electrode 24a and the bonding layer 51 is not limited to normal temperature bonding that is direct bonding under normal temperature. For example, direct bonding may alternatively be performed by applying an appropriate load while heating at a temperature of 100° C. or lower. Furthermore, the lower electrode 24a and the bonding layer 51 are electrically connected to each other due to the bonding. Consequently, the lower electrode 24a and the bonding layer 51 can collectively be considered as a lower electrode.

In addition, in the bonding step, the material of the bonding layer 51 for bonding together the lower electrode 24a and the first substrate 20 is not limited to metal that enables direct bonding with the lower electrode 24a. For example, a room temperature-setting resin adhesive (for example, a two-component room temperature-setting epoxy resin-based adhesive or a one-component room temperature-setting epoxy resin-based adhesive) may be adopted as the material of the bonding layer 51 and the lower electrode 24a and the first substrate 20 may be bonded at normal temperature via the bonding layer 51. Even in this case, a lower bonding temperature can be realized in a similar manner to normal temperature bonding. Furthermore, the resin adhesive of the bonding layer 51 is not limited to room temperature-setting resin adhesives and, for example, a thermosetting resin adhesive (for example, a thermosetting epoxy resin-based adhesive) may be used as long as a setting temperature of the resin adhesive is not more than 150° C.

After the bonding step described above, as shown in FIG. 1C, a transferring step is performed in which a laser beam LB having a predetermined wavelength that passes through the second substrate 40 is irradiated from the side of other surface of the second substrate 40 to transfer the ferroelectric film 24b that overlaps with the seed layer 124c among the ferroelectric layer 124b and the seed layer 124c onto the side of said one surface (the first surface side) of the first substrate 20. In the transferring step, in the present embodiment, the seed layer 124c constitutes the upper electrode 24c. In other words, in the present embodiment, a laminated film of the ferroelectric film 24b and the upper electrode 24c is transferred in the transferring step.

In the transferring step described above, a beam with a wavelength which passes through the second substrate 40, which is reflected by the seed layer 124c, and which is absorbed by the second portion $24b_2$ that does not overlap with the seed layer 124c among the ferroelectric layer 124b is adopted as the laser beam LB with the predetermined wavelength.

As the laser beam LB is absorbed by the second portion $24b_2$ of the ferroelectric layer 124b, the second portion $24b_2$ heats up rapidly. Accordingly, the second portion $24b_2$ thermally expands and is partially thermally decomposed.

When the second portion $24b_2$ thermally expands and is partially thermally decomposed, a difference in thermal expansion instantaneously occurs between the first portion $24b$ and the second portion $24b_2$. As a result, at an interface between the second portion $24b_2$ and the first portion $24b$, the second portion $24b_2$ is separated from the first portion $24b$. In addition, when the second portion $24b_2$ expands, a force is generated in a direction that separates the second substrate from the first substrate. As a result, the second substrate and the seed layer 124c are separated from each other. Furthermore, when the second portion $24b_2$ is partially thermally decomposed, an adhesion strength between the lower electrode 24a and the second portion $24b_2$ decreases. Accordingly, when separating the first substrate 20 and the second substrate 40 from each other, the second substrate 40 can be separated together with the second portion from the first substrate 20.

Figure 2:
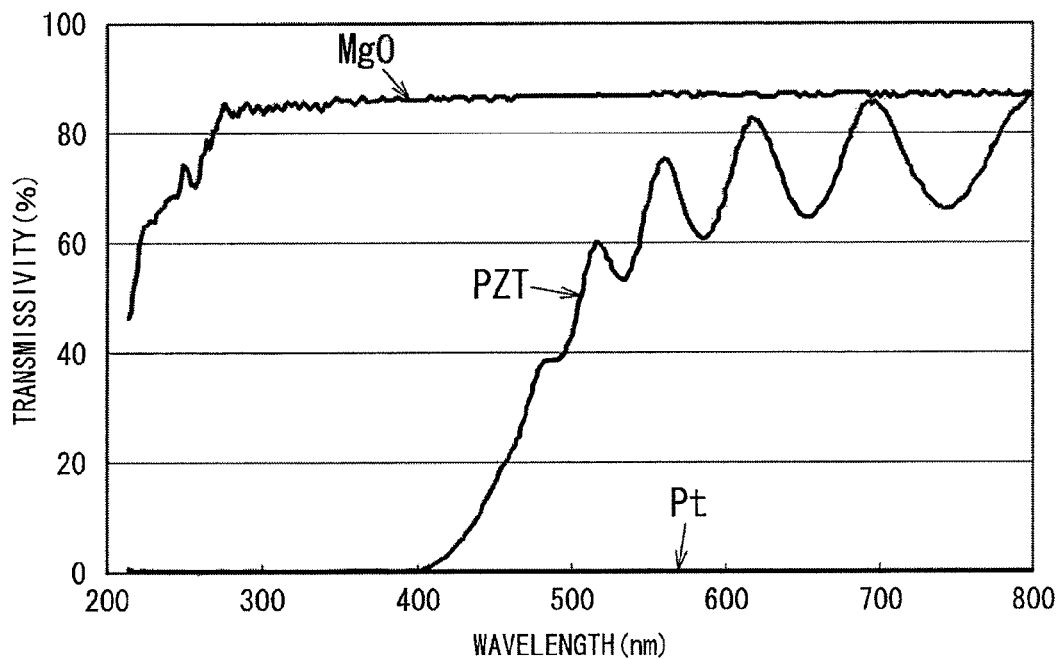
FIG. 2 is a spectroscopic characteristic diagram of materials used when manufacturing a ferroelectric device according to the first embodiment.

Meanwhile, MgO, PZT, and Pt respectively have spectroscopic characteristics shown in FIG. 2. Therefore, when the materials of the second substrate 40, the ferroelectric layer 124b, and the seed layer 124c are respectively MgO, PZT, and Pt, the predetermined wavelength of the laser beam LB may be set to at least 400 nm. As a laser beam source in this case, for example, a femtosecond laser with a fundamental wavelength of 750 nm to 1100 nm (for example, a Ti-sapphire substrate) may be used. Alternatively, a KrF excimer laser with a wavelength of 248 nm, an ArF excimer laser with a wavelength of 193 nm, or a third harmonic of a femtosecond laser may be used. In addition, an energy density of the laser beam LB may be set to, for example, around 5 to 15 mJ/mm². In this case, a part of the laser beam LB that is directed toward the ferroelectric film 24b of the ferroelectric layer 124b is reflected by the seed layer 124c. Furthermore, since the laser beam LB is not absorbed by the ferroelectric film 24b, changes to a physical property of the ferroelectric film 24b during the transferring step can be prevented. In FIG. 1C, a solid arrow schematically represents the laser beam LB directed toward the seed layer 124c and a dashed arrow schematically represents the laser beam LB directed toward the second portion $24b_2$ of the ferroelectric layer 124b.

After the transferring step described above, by performing a peeling step in which the first substrate 20 and the second substrate 40 are pulled apart from each other to separate the second substrate 40, a structure shown in FIG. 1D is obtained.

After the peeling step, by performing a lower electrode patterning step in which the lower electrode 24a is patterned using a photolithographic technique and an etching technique, the lower electrode 24a, and the metal wiring 26a and the pad 27a constituted by parts of the lower electrode 24a prior to the patterning are formed (the lower electrode 24a, the metal wiring 26a, and the pad 27a after the patterning can be collectively considered as a single lower electrode 24a). Subsequently, an insulating layer forming step is performed in which the insulating layer 25 is formed on the side of said one surface (the first surface side) of the first substrate 20, and a wiring forming step is next performed in which the metal wiring 26c and the pad 27c are formed using a thin film formation technique such as sputtering or CVD, a photolithographic technique, and an etching technique. Subsequently, by performing a substrate processing step in which the first substrate 20 is processed using a photolithographic technique and an etching technique to form the cantilever section 22 and the weight section 23, a structure shown in FIG. 1E is obtained. Moreover, in the present embodiment, although the metal wiring 26a and the pad 27a are formed by performing the lower electrode patterning step, the formation of the metal wiring 26a and the pad 27a is not limited thereto. Alternatively, a wiring forming step for forming the metal wiring 26a and the pad 27a may be separately provided between the lower electrode patterning step and the insulating layer forming step, or a metal wiring forming step for forming the metal wiring 26a and a pad forming step for forming the pad 27a may be separately provided between the lower electrode patterning step and the insulating layer forming step. Furthermore, in the insulating layer forming step, while patterning is performed using a photolithographic technique and an etching technique after film formation of the insulating layer 25 is performed on the entire one surface (the entire first surface) of the first substrate 20 by CVD or the like, the insulating layer 25 may alternatively be formed using a liftoff method.

After the substrate processing step described above, by performing a cover bonding step in which the respective cover substrates 10 and 30 are bonded to the first substrate 20, a power-generating device that is structured as shown in FIG. 1F is obtained. In this case, the steps up to and including the cover bonding step are performed on a wafer level until the conclusion of the cover bonding step, and a dicing step is subsequently performed to divide the wafer into individual power-generating devices. Moreover, the respective cover substrates 10 and 30 may be formed by appropriately applying known processes such as photolithography, etching, thin film formation, and plating.

As described earlier, the power-generating device (a ferroelectric device) according to the present embodiment comprises the power-generating section 24. The power-generating section 24 comprises a piezoelectric transducing section. The piezoelectric transducing section is formed in the cantilever section 22 of the first substrate 20 and generates an alternating-current voltage in response to vibration of the cantilever section 22. The power-generating section 24 comprises the lower electrode 24a, the ferroelectric film 24b, and the upper electrode 24c. The lower electrode 24a is formed on the side of one surface (the first surface side) of the cantilever section 22. The ferroelectric film 24b is formed on the lower electrode 24a on a side opposite to the cantilever section 22. The upper electrode 24c is formed on the ferroelectric film 24b on a side opposite to the lower electrode 24a. In addition, the method for manufacturing the power-generating device (the ferroelectric device) comprises a seed layer forming step, a ferroelectric layer forming step, a lower electrode forming step, a bonding step, and a transferring step. In the seed layer forming step, the seed layer 124c with a predetermined pattern and made from a metallic material is formed on one surface of the second substrate 40. The ferroelectric layer forming step is performed after the seed layer forming step. In the ferroelectric layer forming step, the ferroelectric layer 124b is formed on the side of said one surface (the first surface side) of the second substrate 40. The lower electrode forming step is performed after the ferroelectric layer forming step. In the lower electrode forming step, the lower electrode 24a is formed on the ferroelectric layer 124b. The bonding step is performed after the lower electrode forming step. In the bonding step, the lower electrode 24a and the first substrate 20 are bonded together via the bonding layer 51. The transferring step is performed after the bonding step. In the bonding step, a laser beam LB with a predetermined wavelength is irradiated from the side of said other surface (the second surface side) of the second substrate 40. Accordingly, the ferroelectric film 24b constituted by a first portion that overlaps with the seed layer 124c among the ferroelectric layer 124b and the seed layer 124c are transferred onto the side of said one surface of the first substrate 20. Furthermore, the predetermined wavelength of the laser beam LB satisfies the following conditions. The predetermined wavelength passes through the second substrate 40. The predetermined wavelength is reflected by the seed layer 124c. The predetermined wavelength is absorbed by the second portion $24b_2$ that does not overlap with the seed layer 124c among the ferroelectric layer 124b.

Therefore, in the transferring step, only the ferroelectric film 24b on the seed layer 124c among the ferroelectric layer 124b can be transferred. As a result, by conforming a predetermined pattern of the seed layer 124c to a desired pattern of the ferroelectric film 24b, a step for patterning the ferroelectric film 24b using a photolithographic technique and an etching technique need not be provided after the transferring step. Consequently, the manufacturing process can be simplified and cost reduction can be achieved. In addition, the second substrate 40 is peeled in a peeling step following the transferring step. Therefore, the second substrate 40 that is expensive as in a case of a single-crystal MgO substrate can be reused and cost reduction can be achieved.

In addition, the ferroelectric film 24b differs in lattice constants from the first substrate 20.

Furthermore, the second substrate 40 has a better lattice consistency with the ferroelectric film 24b than the first substrate 20.

In other words, the lattice constant of a material of the first substrate 20 has a first difference from the lattice constant of a material of the ferroelectric film 24b. The lattice constant of a material of the second substrate 40 has a second difference from the lattice constant of the material of the ferroelectric film 24b. The second difference is smaller than the first difference.

In addition, the seed layer 124c is made of a metallic material having good lattice consistency with the ferroelectric film 24b.

In summary, the power-generating device (the ferroelectric device) according to the present embodiment comprises a power-generating section 24 constituted by a piezoelectric transducing section which is formed in a cantilever section 22 of a first substrate 20 and which generates an alternating-current voltage in response to vibration of the cantilever section 22, wherein the power-generating section 24 comprises a lower electrode 24a formed on one surface (a first surface) of the cantilever section 22, a ferroelectric film 24b which is formed on the lower electrode 24a on a side opposite to the cantilever section 22 and which is made of a ferroelectric material having a difference in lattice constants from the first substrate 20, and an upper electrode 24c formed on the ferroelectric film 24b on a side opposite to the lower electrode 24a. In addition, a method for manufacturing the same comprises: a seed layer forming step of forming a seed layer 124c with a predetermined pattern and made from a metallic material with good lattice consistency with the ferroelectric film 24b on one surface of the second substrate 40 with better lattice consistency with the ferroelectric film 24b than the first substrate 20; a ferroelectric layer forming step of forming a ferroelectric layer 124b on the side of said one surface (the first surface side) of the second substrate 40 after the seed layer forming step; a lower electrode forming step of forming the lower electrode 24a on the ferroelectric layer 124b after the ferroelectric layer forming step; a bonding step of bonding together the lower electrode 24a and the first substrate 20 via a bonding layer 51 after the lower electrode forming step; and a transferring step of transferring the ferroelectric film 24b constituted by a first portion which overlaps the seed layer 124c among the ferroelectric layer 124b and the seed layer 124c onto the side of said one surface of the first substrate 20 after the bonding step by irradiating a laser beam LB with a predetermined wavelength from the side of said other surface (a second surface side) of the second substrate 40, wherein the laser beam LB with the predetermined wavelength is a beam with a wavelength which enables the laser beam LB to pass through the second substrate 40, which is reflected by the seed layer 124c, and which is absorbed by a second portion $24b_2$ that does not overlap with the seed layer 124c among the ferroelectric layer 124b.

In addition, with the method for manufacturing a power-generating device according to the present embodiment, crystallinity and performance (in this case, a piezoelectric constant $e_{31}$) of the ferroelectric film 24b can be improved regardless of the substrate material used for the first substrate 20, cost reduction can be achieved, and the manufacturing process can be simplified. Essentially, the piezoelectric constant $e_{31}$ of the ferroelectric film 24b can be increased and a relative permittivity of the ferroelectric film 24b can be reduced in comparison to a case where the ferroelectric film 24b is formed on the side of said one surface of the first substrate 20 using a thin film formation technique. At the same time, a highly-reliable power-generating device can be provided by using the first substrate 20 that has a higher mechanical strength than the second substrate 40. Furthermore, since only the ferroelectric film 24b on the seed layer 124c among the ferroelectric layer 124b can be transferred in the transferring step, by conforming the predetermined pattern of the seed layer 124c to a desired pattern of the ferroelectric film 24b, a step of patterning the ferroelectric film 24b using a photolithographic technique and an etching technique need not be provided after the transferring step. As a result, the manufacturing process can be simplified and cost reduction can be achieved. In addition, since the second substrate 40 is peeled in a peeling step after the transferring step, the second substrate 40 that is expensive as in a case of a single-crystal MgO substrate can be reused and cost reduction can be achieved.

Figure 3:
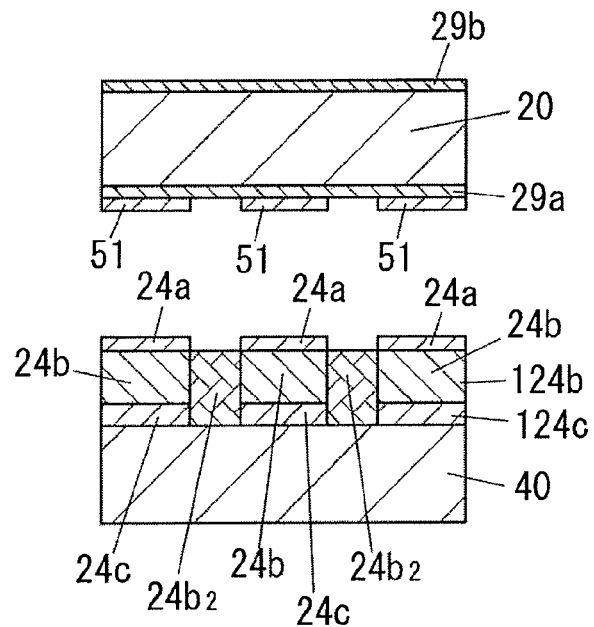
FIG. 3 is a sectional primary process chart for explaining the method for manufacturing a ferroelectric device according to the first embodiment.

Furthermore, by adopting a metal that enables direct bonding with the lower electrode 24a as the material of the bonding layer 51, patterning the bonding layer 51 on the side of said one surface (the first surface side) of the first substrate 20 as shown in FIG. 3 before the bonding step, and forming the bonding layer 51 only in portions corresponding to the ferroelectric film 24b and the lower electrode 24a, only locations of the first substrate 20 where the bonding layer 51 has been formed can be bonded. As a result, the effect of level differences of the surface of the ferroelectric layer 124b can be reduced and bonding reliability can be increased. In addition, the second portion $24b_2$ of the ferroelectric layer 124b can be more reliably prevented from being transferred in the transferring step.

In addition, with the power-generating device according to the present embodiment, the piezoelectric constant $e_{31}$ can be increased in comparison to a case where the ferroelectric film 24b is constituted by an AlN thin film, the piezoelectric constant $e_{31}$ can be even further increased in comparison to a case where the ferroelectric film 24b is constituted by a polycrystalline PZT thin film formed on the side of said one surface (the first surface side) of the first substrate 20. As a result, a higher output can be achieved due to improved power-generating efficiency. Furthermore, relative permittivity can be reduced in comparison to a case where the ferroelectric film 24b is constituted by the aforementioned polycrystalline PZT thin film and power-generating efficiency can be improved due to reduced parasitic capacitance.

In addition, with the method for manufacturing a power-generating device according to the present embodiment, a greater number of options for the material of the cantilever section 22 are provided. As a result, design freedom of a power-generating device increases, a power-generating device with desired vibration characteristics can be readily manufactured, and power-generating devices with a wide variety of vibration characteristics can be realized.

Furthermore, with the method for manufacturing a power-generating device according to the present embodiment, in the bonding step, a Au layer is used as the bonding layer 51. By constituting the lower electrode 24a using a Au layer, the Au layer of the lower electrode 24a and the Au layer of the bonding layer 51 (in other words, the respective Au layers) can be directly bonded together at a low temperature by normal temperature bonding or the like. As a result, a lower processing temperature can be achieved and properties of the ferroelectric film 24b can be prevented from deteriorating during the bonding step. Alternatively, a resin layer made of an epoxy resin or the like may be used as the bonding layer 51 in the bonding step, in which case bonding can be performed at a lower temperature in comparison to eutectic bonding or the like. Moreover, direct bonding of the respective Au layers is not limited to normal temperature bonding and may alternatively be performed by applying an appropriate amount of heat (for example, 100° C.) and an appropriate load.

In addition, with the method for manufacturing a power-generating device according to the present embodiment, since the ferroelectric material of the ferroelectric film 24b is a lead-based piezoelectric material and any of a single-crystal MgO substrate, a single-crystal SrTiO$_3$ substrate, and a sapphire substrate is used as the second substrate 40, the ferroelectric film 24b that is a piezoelectric film with favorable crystallinity can be formed. Furthermore, since a single-crystal silicon substrate is used as the first substrate 20, reliability can be improved and cost reduction can be achieved.

Figure 7:
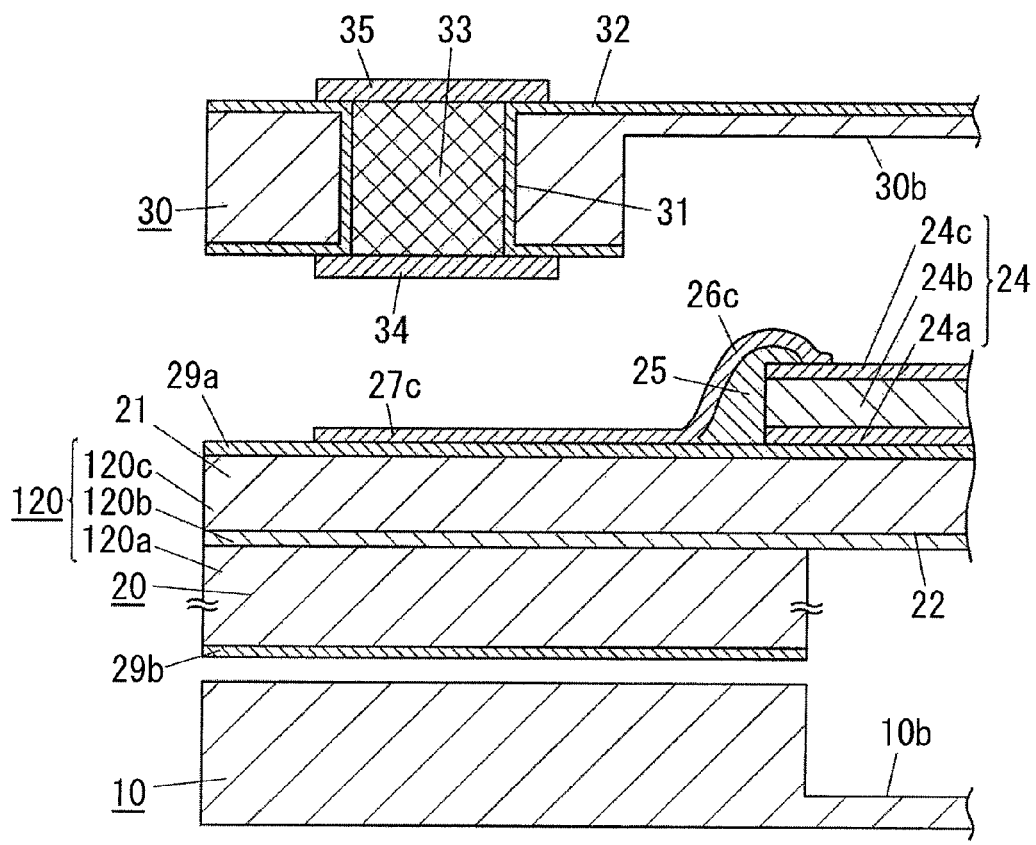
FIG. 7 is a schematic exploded sectional view of another configuration example of the ferroelectric device according to the first embodiment.

As the first substrate 20, for example, as shown in FIG. 7, an SOI substrate 120 may be used which comprises a single-crystal silicon layer (active layer) 120c on an insulating layer (embedded oxide film) 120b constituted by a silicon oxide film on a supporting substrate 120a constituted by a single-crystal silicon substrate. In this case, by using the insulating layer 120b of the SOI substrate 120 as an etching stopper layer when forming the cantilever section 22 during manufacturing, accuracy of the thickness of the cantilever section 22 can be improved and, at the same time, reliability can be improved and cost reduction can be achieved.

In addition, as the first substrate 20, a substrate selected from the group consisting of metallic substrates (for example, a SUS substrate or a Ti substrate), glass substrates, and polymer substrates may be used. While an improvement in reliability can be achieved by using any one of these substrates, a metallic substrate or a glass substrate is preferably used from the perspective of mechanical strength. As a polymer of the polymer substrate, for example, polyethylene terephthalate may be adopted.

Meanwhile with the power-generating device according to the present embodiment, since the weight section 23 is provided at a tip section of the cantilever section 22, power generation can be increased in comparison to a case where the weight section 23 is not provided. An arrangement may be adopted in which an adhesion step of adhering the weight section 23 to the tip section of the cantilever section 22 in the first substrate 20 using an adhesive or the like is performed after the peeling step. In this case, since the weight section 23 is adhered to the tip section of the cantilever section 22 after the peeling step, respective design freedom of a shape and a material of the weight section 23 increases. As a result, a power-generating device with even greater power generation can be manufactured, and since the cantilever section 22 and the weight section 23 can respectively be fabricated freely, a higher degree of freedom of the manufacturing process can be achieved.

Second Embodiment

Figure 8:
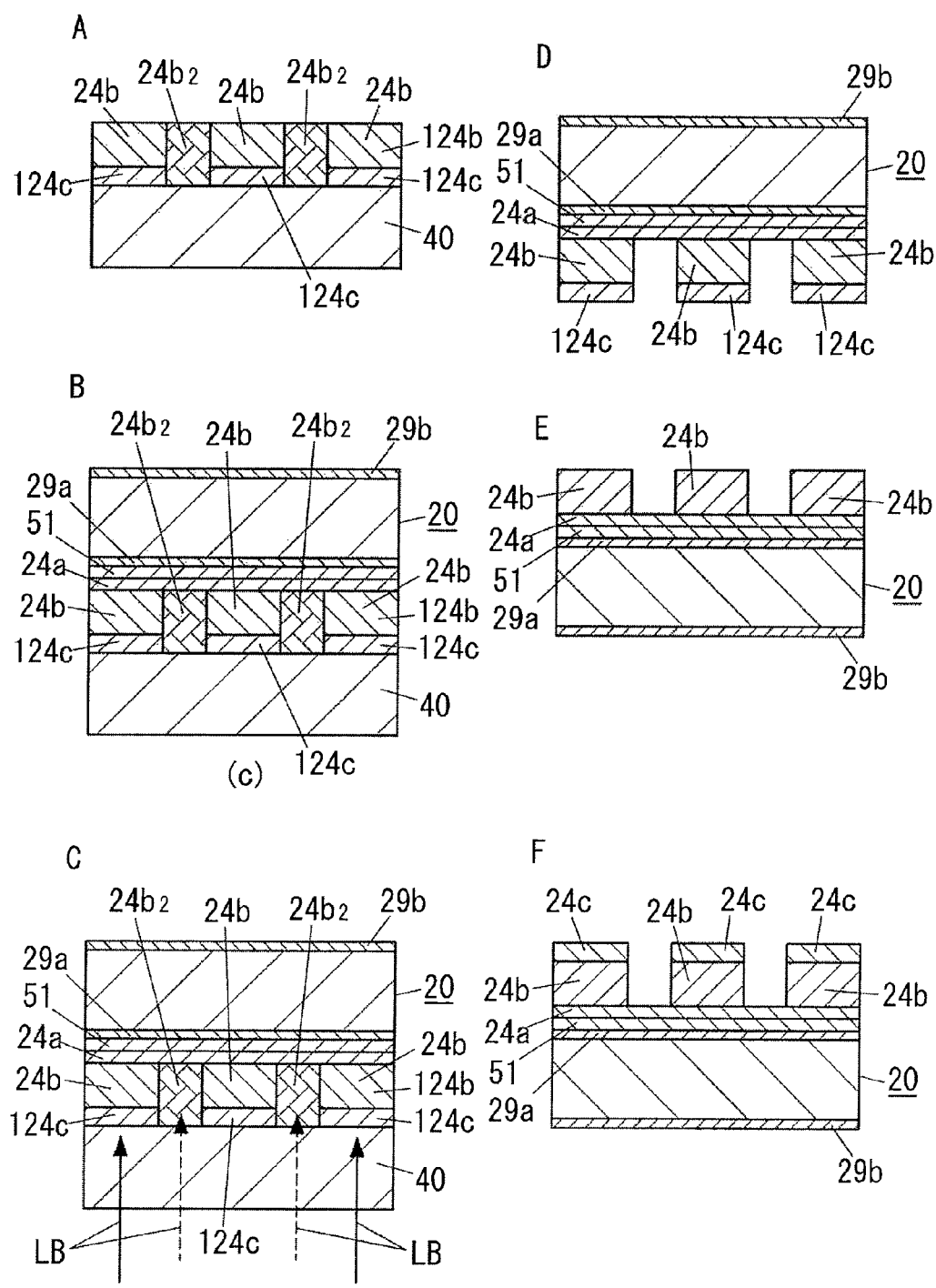
FIG. 8 is a sectional primary process chart for explaining a method for manufacturing a ferroelectric device according to a second embodiment.

First, a ferroelectric device according to the present embodiment will be described with reference to FIG. 8F and, subsequently, a manufacturing method will be described with reference to FIG. 8.

As shown in FIG. 8F, a ferroelectric device according to the present embodiment comprises a lower electrode 24a formed on aside of one surface (a first surface side) of a first substrate 20, a ferroelectric film 24b formed on an opposite side of the lower electrode 24a to the first substrate 20, and an upper electrode 24c formed on an opposite side of the ferroelectric film 24b to the side of the lower electrode 24a. In this case, the ferroelectric film 24b is formed of a ferroelectric material that has difference in lattice constants from the first substrate 20. Moreover, components of the ferroelectric device that are similar to those in the first embodiment are denoted by the same reference characters.

The ferroelectric device according to the present embodiment is a pyroelectric device and the ferroelectric film 24b is a pyroelectric film.

The pyroelectric device according to the present embodiment adopts PZT that is a type of a lead-based oxide ferroelectric as the ferroelectric material (pyroelectric material) of the ferroelectric film 24b and uses a single-crystal silicon substrate in which a (100) plane constitutes said one surface (the first surface) as the first substrate 20. However, the lead-based oxide ferroelectric is not limited to PZT and PZT-PLT, PLT, PZT-PMN, or another impurity-added PZT-based ferroelectric may be adopted instead. In any case, the pyroelectric material of the ferroelectric film 24b is a ferroelectric material (a lead-based oxide ferroelectric such as PZT, PZT-PMN, or an impurity-added PZT) with a difference in lattice constants from the first substrate 20. In addition, the silicon substrate that is used as the first substrate 20 is not limited to a single-crystal silicon substrate and may alternatively be a polycrystalline silicon substrate.

In addition, in the present embodiment, Au is adopted as the material of the lower electrode 24a, a conductive infrared-absorbing material such as Ni—Cr, Ni, and niello is adopted as the material of the upper electrode 24c, and the lower electrode 24a, a pyroelectric thin film 24b, and the upper electrode 24c constitute a sensing element 230. However, these materials are not limited to specific materials, and, for example, Al, Cu, and the like may be adopted as the material of the lower electrode 24a. In a case where the conductive infrared-absorbing material described above is adopted as the material of the upper electrode 24c, the upper electrode 24c doubles as an infrared-absorbing film.

Furthermore, the first substrate 20 is not limited to a single-crystal silicon substrate and a substrate selected from the group consisting of metallic substrates (for example, a SUS substrate or a Ti substrate), glass substrates, and polymer substrates may be used instead. As a polymer of the polymer substrate, for example, polyethylene terephthalate (PET) or polyimide may be adopted.

When using the pyroelectric device described above as a pyroelectric infrared sensor, for example, as shown in FIGS. 9A to 9D, a supporting substrate 210 that supports the first substrate 20 comprising the sensing element 230 on the side of said one surface (the first surface) of the first substrate 20 may be bonded to the side of other surface (a second surface side) of the first substrate 20. Preferably, a cavity 211 for thermal insulation is formed in the supporting substrate 210 to thermally insulate the sensing element 230 and the supporting substrate 210 from each other. In this case, as the supporting substrate 210, a substrate selected from the group consisting of single-crystal silicon substrates, glass substrates, and polymer substrates (for example, a PET substrate) may be used. Alternatively, the cavity 211 for thermal insulation may be formed on the first substrate 20 without providing the supporting substrate 210. When providing the cavity 211 on the first substrate 20, the cavity 211 may be formed by etching from the side of the side of said one surface (the first surface side) of the first substrate 20 or by etching from the side of the side of said other surface (the second surface side) of the first substrate 20.

A pyroelectric infrared sensor configured as shown in FIGS. 9A and 9B described above comprises one sensing element 230. On the other hand, a pyroelectric infrared sensor configured as shown in FIGS. 9C and 9D is an infrared array sensor (infrared image sensor) in which a plurality of sensing elements 230 are arranged in a two-dimensional array and in which each sensing element 230 constitutes a pixel.

Moreover, in the pyroelectric device according to the present embodiment, a thickness of the lower electrode 24a is set to 100 nm, a thickness of the ferroelectric film 24b is set to 1 μm to 3 μm, and a thickness of the upper electrode 24c is set to 50 nm. However, these numerical values are merely examples and are not particularly restrictive.

With the pyroelectric device according to the present embodiment, if $\gamma[C/(cm^2 \cdot K)]$ denotes a pyroelectric coefficient of the ferroelectric film 24b, $\epsilon$ denotes permittivity, and $F_\gamma[C/(cm^2 \cdot J)]$ denotes a performance index of the pyroelectric device, a relationship expressed by $F_\gamma \propto \gamma/\epsilon$ is satisfied, wherein the greater the pyroelectric coefficient $\gamma$ of the ferroelectric film 24b, the greater the performance index $F_\gamma$ of the pyroelectric device.

Hereinafter, while a method for manufacturing a pyroelectric device that is a ferroelectric device according to the present embodiment will be described with reference to FIG. 8, descriptions of steps similar to those of the method for manufacturing a ferroelectric device described in the first embodiment will be omitted as appropriate.

First, a seed layer forming step is performed in which a seed layer 124c having a predetermined pattern and made of a metallic material (for example, Pt) with a good lattice consistency with the ferroelectric film 24b is formed on the side of one surface (the first surface side) of the second substrate 40 made of a single-crystal MgO substrate having a better lattice consistency with the ferroelectric film 24b than the first substrate 20. Subsequently, by performing a ferroelectric layer forming step in which a ferroelectric layer 124b made of a ferroelectric material (for example, PZT) of the ferroelectric film 24b is formed on the side of said one surface (the first surface side) of the second substrate 40, a structure shown in FIG. 8A is obtained. In this case, while a single-crystal MgO substrate in which a (001) plane constitutes the said one surface (the first surface) is used as the second substrate 40, the second substrate 40 is not limited thereto and a single-crystal $SrTiO_3$ substrate in which a (001) plane constitutes the side of said one surface (the first surface side) or a sapphire substrate in which a (0001) plane constitutes said one surface (the first surface) may alternatively be adopted.

After the ferroelectric layer forming step described above, by first performing a lower electrode forming step in which the lower electrode 24a is formed on the ferroelectric layer 124b and then performing a bonding step in which the lower electrode 24a and the first substrate 20 are bonded together via the bonding layer 51, a structure shown in FIG. 8B is obtained. In this bonding step, in a similar manner to the first embodiment, after arranging the lower electrode 24a constituted by a first Au layer and the bonding layer 51, on which a second Au layer is formed on an outermost surface of the bonding layer 51, so as to oppose each other, the lower electrode 24a and the bonding layer 51 may be bonded together by normal temperature bonding.

In addition, in the bonding step, the material of the bonding layer 51 for bonding together the lower electrode 24a and the first substrate 20 is not limited to metal that enables direct bonding with the lower electrode 24a. For example, a room temperature-setting resin adhesive (for example, a two-component room temperature-setting epoxy resin-based adhesive or a one-component room temperature-setting epoxy resin-based adhesive) may be adopted as the material of the bonding layer 51 and the lower electrode 24a and the first substrate 20 may be bonded at normal temperature via the bonding layer 51. Even in this case, a lower bonding temperature can be realized in a similar manner to normal temperature bonding. Furthermore, the resin adhesive of the bonding layer 51 is not limited to room temperature-setting resin adhesives and, for example, a thermosetting resin bonding (for example, a thermosetting epoxy resin-based adhesive) may be used as long as a setting temperature of the resin adhesive is not more than 150° C.

After the bonding step described above, as shown in FIG. 8C, a transferring step is performed in which a laser beam LB having a predetermined wavelength that passes through the second substrate 40 is irradiated from the side of other surface of the second substrate 40 to transfer the ferroelectric film 24b that overlaps with the seed layer 124c among the ferroelectric layer 124b and the seed layer 124c onto the side of said one surface of the first substrate 20.

In the transferring step described above, in a similar manner to the first embodiment, a beam with a wavelength which passes through the second substrate 40, which is reflected by the seed layer 124c, and which is absorbed by the second portion $24b_2$ that does not overlap with the seed layer 124c among the ferroelectric layer 124b is adopted as the laser beam LB with the predetermined wavelength.

After the transferring step described above, by performing a peeling step in which the first substrate 20 and the second substrate 40 are pulled apart from each other to separate the second substrate 40, a structure shown in FIG. 8D is obtained.

After the peeling step described above, by performing a seed layer removing step in which the seed layer 124c is removed by ion beam etching or the like, a structure shown in FIG. 8E is obtained. In this case, the seed layer 124c is removed because a Pt film characteristically reflects infrared rays.

After the seed layer removing step described above, by forming the upper electrode 24c made of Ni—Cr, Ni, niello, or the like by sputtering, vapor deposition, CVD, or the like, a pyroelectric device structured as shown in FIG. 8F is obtained. In the structure shown in FIG. 8F, the upper electrode 24c also functions as an infrared-absorbing film.

After the pyroelectric device structured as shown in FIG. 8F is obtained, by pasting the pyroelectric device on a supporting substrate 210 (refer to FIGS. 9A to 9D) provided with the cavity 211 for thermal insulation (heat insulation) and performing appropriate patterning, a pyroelectric infrared sensor is obtained. Alternatively, after obtaining the pyroelectric device structured as shown in FIG. 8F, a cavity for thermal insulation (heat insulation) may be formed by etching the first substrate 20 from the side of the side of said one surface (the first surface side) or from the side of said other surface (the second surface side).

With the method for manufacturing a ferroelectric device (pyroelectric device) according to the present embodiment described above, crystallinity and performance (in this case, a pyroelectric coefficient γ) of the ferroelectric film 24b can be improved regardless of the substrate material used for the first substrate 20, cost reduction can be achieved, and the manufacturing process can be simplified. Essentially, the pyroelectric coefficient γ of the ferroelectric film 24b can be increased in comparison to a case where the ferroelectric film 24b is formed on the side of said one surface (the first surface side) of the first substrate 20 using a thin film formation technique. In addition, a highly-reliable power-generating device can be provided by using the first substrate 20 that has a higher mechanical strength than the second substrate 40. Furthermore, since only the ferroelectric film 24b on the seed layer 124c among the ferroelectric layer 124b can be transferred in the transferring step, by conforming the predetermined pattern of the seed layer 124c to a desired pattern of the ferroelectric film 24b, a step of patterning the ferroelectric film 24b using a photolithographic technique and an etching technique need not be provided after the transferring step. As a result, the manufacturing process can be simplified and cost reduction can be achieved. In addition, since the second substrate 40 is peeled in a peeling step after the transferring step, the second substrate 40 that is expensive as in a case of a single-crystal MgO substrate can be reused and cost reduction can be achieved.

Furthermore, with the manufacturing method according to the present embodiment, in a similar to the first embodiment, by adopting a metal that enables direct bonding with the lower electrode 24a as the material of the bonding layer 51, patterning the bonding layer 51 on the side of said one surface (the first surface side) of the first substrate 20 before the bonding step, and forming the bonding layer 51 only in portions corresponding to the ferroelectric film 24b and the lower electrode 24a, only locations of the first substrate 20 where the bonding layer 51 has been formed can be bonded. As a result, the effect of level differences of the surface of the ferroelectric layer 124b can be reduced and bonding reliability can be increased. In addition, the second portion $24b_2$ of the ferroelectric layer 124b can be more reliably prevented from being transferred in the transferring step.

In addition, the method for manufacturing a ferroelectric device according to the present embodiment is similarly capable of lowering a processing temperature of the bonding step and preventing changes to a physical property of the ferroelectric film 24b (deterioration of the characteristics of the ferroelectric film 24b) during the bonding step. In this case, since the processing temperature of the bonding step is not limited to normal temperature (room temperature) and, for example, a temperature equal to or lower than half of a Curie temperature of the ferroelectric film 24b (with PZT, around 350° C.) enables changes to the physical property of the ferroelectric film 24b to be reliably prevented, the bonding step is not limited to normal temperature bonding and direct bonding in which an appropriate load is applied in a heated state of not more than 150° C. can be alternatively performed.

Moreover, in a case where the pyroelectric material of the ferroelectric film 24b is a lead-based oxide ferroelectric, by using any of a single-crystal MgO substrate, a single-crystal $SrTiO_3$ substrate, and a sapphire substrate as the second substrate 40, the ferroelectric film 24b with favorable crystallinity can be formed. In addition, by using a silicon substrate (a single-crystal silicon substrate or a polycrystalline silicon substrate), a SOI substrate, a glass substrate, a metallic substrate, a polymer substrate, or the like that is less expensive than the second substrate 40 as the first substrate 20, cost reduction can be achieved.

EXPLANATION OF REFERENCE NUMERALS 20 first substrate
24a lower electrode
24b ferroelectric film (first portion)
$24b_2$ second portion
24c upper electrode
40 second substrate
51 bonding layer
124b ferroelectric layer
124c seed layer
LB laser beam.

The invention claimed is:

1. A method for manufacturing a ferroelectric device, wherein said ferroelectric device comprising:
   a lower electrode formed on a side of one surface of a first substrate,
   a ferroelectric film formed on a opposite side of the lower electrode to a side of the first substrate, and
   an upper electrode formed on a opposite side of the ferroelectric film to a side of the lower electrode,
wherein said ferroelectric film comprises a ferroelectric material,
wherein said method comprising:
   a seed layer forming step of forming a seed layer having a predetermined pattern on a side of one surface of a second substrate and made from a metallic material;
   a ferroelectric layer forming step of forming a ferroelectric layer made of the ferroelectric material on the side of said one surface of the second substrate after the seed layer farming step;
   a lower electrode forming step of forming the lower electrode on the ferroelectric layer after the ferroelectric layer forming step;
   a bonding step of bonding the lower electrode and the first substrate via a bonding layer after the lower electrode forming step; and
   a transferring step of transferring the ferroelectric film and the seed layer onto the side of said one surface of the first substrate by irradiating a laser beam with a predetermined wavelength from a side of other surface of the second substrate after the bonding step, wherein said ferroelectric film is formed form a first portion of the ferroelectric layer, said first portion overlapping on the seed layer,
   wherein said laser beam with the predetermined wavelength is a beam with a wavelength,
   wherein said beam passes though the second substrate, and is reflected by the seed layer, and moreover is absorbed by a second portion of the ferroelectric layer, said second portion not overlapping on the seed layer.

2. The method for manufacturing a ferroelectric device according to claim 1, wherein the ferroelectric material has a difference in lattice constants from the first substrate.

3. The method for manufacturing a ferroelectric device according to claim 1, wherein the second substrate exhibits more consistency with the ferroelectric film than the first substrate.

4. The method for manufacturing a ferroelectric device according to claim 1, wherein the seed layer exhibits a satisfactory lattice consistency with the ferroelectric film.

5. The method for manufacturing a ferroelectric device according to claim 1, wherein said material of the bonding layer is a metal configured to be directly bonded with the lower electrode, and a pattern of the bonding layer is formed on the side of said one surface of the first substrate before the bonding step.

6. The method for manufacturing a ferroelectric device according to claim 1, wherein a room temperature-setting resin adhesive is adopted as said material of the bonding layer.

7. The method for manufacturing a ferroelectric device according to claim 1, wherein said ferroelectric material is PZT.

8. The method for manufacturing a ferroelectric device according to claim 1, wherein said second substrate is a MgO substrate.

9. The method for manufacturing a ferroelectric device according to claim 1, wherein said predetermined wavelength of the laser beam is at least 400 nm.

10. The method for manufacturing a ferroelectric device according to claim 1, wherein said laser beam is any of a femtosecond laser, a third harmonic of a KrF excimer laser, a third harmonic of an ArF excimer laser, and a third harmonic of a femtosecond laser.

11. The method for manufacturing a ferroelectric device according to claim 1, wherein said ferroelectric film is a piezoelectric film and said seed layer is used as the upper electrode.

12. The method for manufacturing a ferroelectric device according to claim 1, wherein said ferroelectric film is a pyroelectric film, a seed layer removing step of removing the seed layer is performed after the transferring step and, subsequently, an upper electrode forming step is performed in which the upper electrode made of an infrared-absorbing material is formed on the ferroelectric film.

13. The method for manufacturing a ferroelectric device according to claim 1, wherein
   a lattice constant of the ferroelectric film has a first difference from a lattice constant of the first substrate,
   the lattice constant of the ferroelectric film has a second difference from a lattice constant of the second substrate, and
   the second difference is smaller than the first difference.

14. The method for manufacturing a ferroelectric device according to claim 1, wherein the seed layer is made of Pt or Al.

15. The method for manufacturing a ferroelectric device according to claim 1, wherein
   said second substrate has a first region and a second region on said one surface of the second substrate, and the first region is covered by the seed layer having the predetermined pattern and, accordingly, the second region is exposed by the seed layer having the predetermined pattern.

16. The method for manufacturing a ferroelectric device according to claim 15, wherein
said first portion of the ferroelectric layer overlaps with the first region, and
said second portion of the ferroelectric layer overlaps with the second region.

* * * * *